US009658263B2

(12) United States Patent
Bartmess et al.

(10) Patent No.: US 9,658,263 B2
(45) Date of Patent: May 23, 2017

(54) METHODS AND SYSTEMS FOR MEASUREMENT AND VERIFICATION WEIGHTING WITH TEMPERATURE DISTRIBUTION

(71) Applicants: Robert Bartmess, Austin, TX (US); Drew Jon Dutton, Austin, TX (US); Suman Olney, Austin, TX (US)

(72) Inventors: Robert Bartmess, Austin, TX (US); Drew Jon Dutton, Austin, TX (US); Suman Olney, Austin, TX (US)

(73) Assignee: Siemens Industry, Inc., Alpharetta, GA (US)

( * ) Notice: Subject to any disclaimer, the term of this patent is extended or adjusted under 35 U.S.C. 154(b) by 1106 days.

(21) Appl. No.: 13/829,089

(22) Filed: Mar. 14, 2013

(65) Prior Publication Data
US 2013/0297242 A1 Nov. 7, 2013

Related U.S. Application Data

(63) Continuation-in-part of application No. 13/463,901, filed on May 4, 2012.

(51) Int. Cl.
*G01R 21/133* (2006.01)
*G06Q 50/06* (2012.01)

(52) U.S. Cl.
CPC ........... *G01R 21/133* (2013.01); *G06Q 50/06* (2013.01)

(58) Field of Classification Search
CPC .................................................... G01R 21/133
USPC .......................................................... 702/61
See application file for complete search history.

(56) References Cited

U.S. PATENT DOCUMENTS

| 2007/0244604 | A1 | 10/2007 | McNally | |
|---|---|---|---|---|
| 2009/0228406 | A1* | 9/2009 | Lopez | G06Q 10/06 705/412 |
| 2010/0262298 | A1* | 10/2010 | Johnson | F24F 11/001 700/277 |
| 2010/0283606 | A1* | 11/2010 | Tsypin | G06Q 30/02 340/540 |
| 2011/0257911 | A1 | 10/2011 | Drees et al. | |

OTHER PUBLICATIONS

PCT Search Report for Application No. PCT/US13/39204, dated Dec. 4, 2014, 7 pages.

* cited by examiner

*Primary Examiner* — Ricky Ngon

(57) ABSTRACT

Systems, methods, and mediums use temperature weighting in energy-usage measurements. A method includes identifying a number of days that each of a plurality of different temperatures occurred at a location during a period of time. The method includes identifying a baseline for initial energy usage at a building located in the location. The method includes receiving measurements for energy usage at the building. The method includes generating an expression for measured energy usage as a function of temperature by performing a regression analysis on the measurements for energy usage. The method includes identifying a difference between the baseline for initial energy usage and the expression for measured energy usage. The method includes generating a weighting for the difference between baseline energy usage and the measured energy usage at one or more temperatures based on the number of days the one or more temperatures occurred during the period of time.

20 Claims, 7 Drawing Sheets

METHODS AND SYSTEMS FOR MEASUREMENT AND VERIFICATION WEIGHTING WITH TEMPERATURE DISTRIBUTION

CROSS REFERENCE TO RELATED APPLICATIONS AND CLAIM OF PRIORITY

This application is a continuation-in-part of and claims priority to U.S. application Ser. No. 13/463,901, filed May 4, 2012, entitled "Methods and Systems for Improved Time Cost and Accuracy of Energy Usage Baselining", which is hereby incorporated by reference.

TECHNICAL FIELD

The present disclosure is directed, in general, to energy usage and, more particularly, to improving energy usage measurement and verification weighting using temperature distribution.

BACKGROUND OF THE DISCLOSURE

In order to measure energy savings provided by implementing management systems and products, it is helpful to have an energy usage baseline to measure current energy usage against. Previously used solutions included metering energy consumption over a long period of time, for example, an entire year, before installing any energy saving products. The requirement for this long period of time for metering is based on the need to acquire sufficient data for temperature and seasonal energy usage variations. One solution for establishing this energy usage baseline would include not implementing the energy saving management systems and products at the energy consumer's location until a year of data could be gathered. This solution would allow all of the temperature changes and operational behavior of the location to be included in the energy usage baseline.

However, modeling energy usage before installing energy saving products can be unreasonable from a business perspective. Consumers do not want to have to wait for a long period of time before realizing energy savings. Business considerations call for reducing the timeframe for establishing this energy usage baseline in order for the consumer to enjoy the benefits of energy saving products. Additionally, it may be difficult for all non-temperature variables, such as traffic level, operational conditions, and appliance efficiency, to remain constant for a year. If some of these variables change, some or all of the data obtained from monitoring the energy usage may become invalid.

Measurement and verification is a method used to compare results of energy efficiency measures implemented against the performance that would have otherwise transpired. This method attempts to control for various independent variables the primary variables being ambient temperature. Temperature adjusted energy savings calculations use a limited set of data, for example a few weeks or months worth of data, to project savings over the course of a year. Using a limited set of data is prone to inaccuracy, because variations may occur in the limited period of time that may not occur as frequently over the course of a given year.

SUMMARY OF THE DISCLOSURE

Various disclosed embodiments relate to systems and methods for temperature weighting in energy-usage measurements.

Various embodiments include automation systems, methods, and mediums Systems, methods, and mediums use temperature weighting in energy-usage measurements. A method includes identifying a number of days that each of a plurality of different temperatures occurred at a location during a period of time. The method includes identifying a baseline for initial energy usage at a building located in the location. The method includes receiving measurements for energy usage at the building. The method includes generating an expression for measured energy usage as a function of temperature by performing a regression analysis on the measurements for energy usage. The method includes identifying a difference between the baseline for initial energy usage and the expression for measured energy usage. Additionally, the method includes generating a weighting for the difference between baseline energy usage and the measured energy usage at one or more temperatures based on the number of days the one or more temperatures occurred during the period of time.

The foregoing has outlined rather broadly the features and technical advantages of the present disclosure so that those skilled in the art may better understand the detailed description that follows. Additional features and advantages of the disclosure will be described hereinafter that form the subject of the claims. Those of ordinary skill in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

FIGS. 1 through 8, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device or system.

Disclosed embodiments recognize that the energy-usage data collected over a few weeks or months may be skewed or biased. For example, the sample distribution (e.g., how many energy-usage data points at each temperature) may not be the same distribution as a whole year's worth of data and is often quite different. Disclosed embodiments recognize that most daily temperatures are heavily toward the middle of the range and fewer data points at the extremes of hot and cold.

Disclosed embodiments use historical temperature distribution to weight energy-usage data in measurement and verification of energy usage predictions. For example, energy-usage data points at commonly occurring temperatures may be considered more reliable for measurement and verification. Similarly, energy-usage data points at extreme ends of the temperature distribution occur less frequently and likely have less impact on annual energy usage. Accordingly, disclosed embodiments improve the accuracy of measurement and verification of energy usage predictions and may reduce an amount of time required for data collection to obtain sufficiently accurate results.

Disclosed embodiments reduce an amount of time needed to establish a baseline of energy usage in a building while improving accuracy of the energy usage baseline. An energy usage baseline is a mathematical relationship for energy usage at a particular location as a function of temperature. As energy usage may vary based on temperature, an energy usage baseline is an effective way to represent energy consumption in a way that is adjusted for temperature.

Disclosed embodiments reduce the data gathering time by combining historical energy-usage data with a sample of current energy-usage measurements from the location to provide an accurate energy usage baseline extended over a temperature range. Disclosed embodiments utilize this energy usage baseline to measure the effect of energy efficiency measures, operational changes, and appliance changes.

Figure 1:
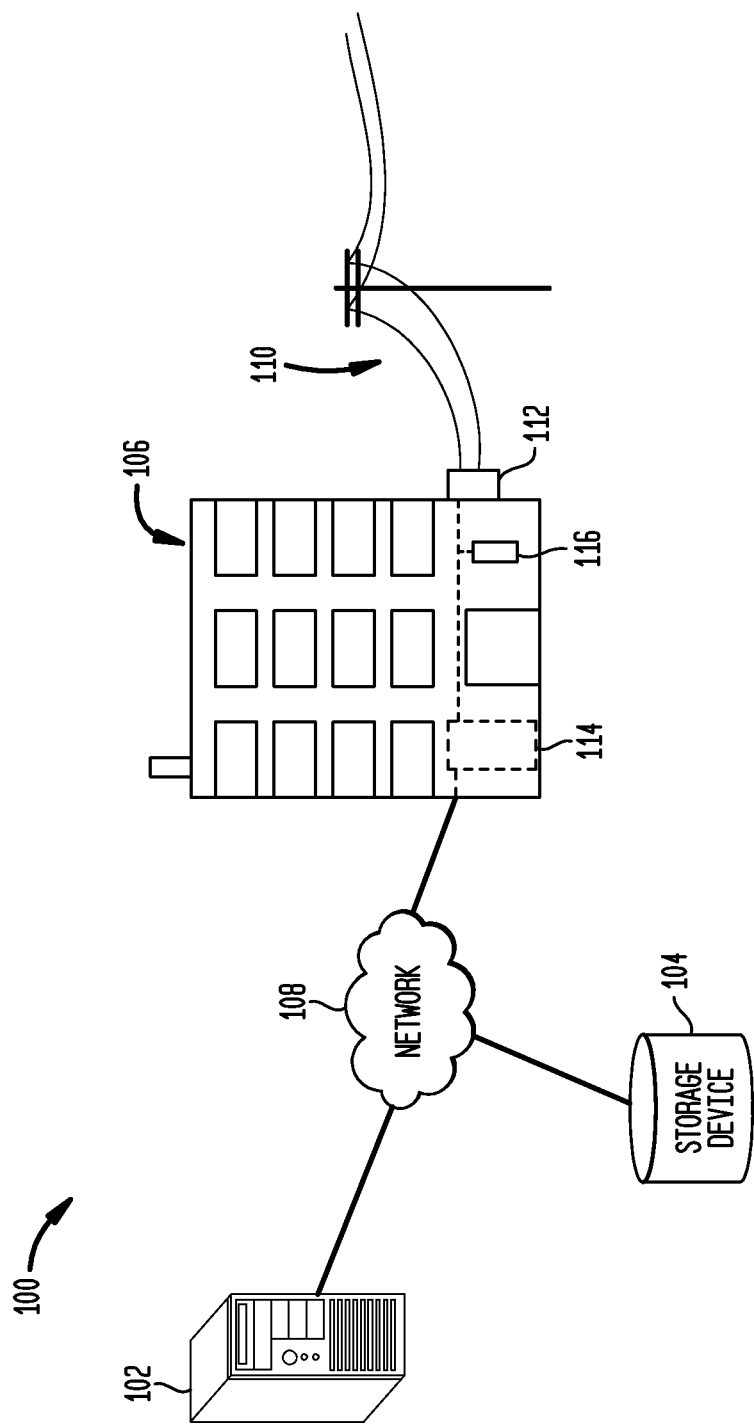
FIG. 1 illustrates a block diagram of an energy monitoring environment in which various embodiments of the present disclosure are implemented.

FIG. 1 illustrates a block diagram of an energy monitoring environment 100 in which various embodiments are implemented. In this illustrative embodiment, the energy monitoring environment 100 includes a data processing system 102 connected to a storage device 104 and a building 106 via a network 108. The network 108 is a medium used to provide communication links between various data processing systems and other devices in the energy monitoring environment 100. Network 108 may include any number of suitable connections, such as wired, wireless, or fiber optic links. Network 108 may be implemented as a number of different types of networks, such as, for example, the internet, a local area network (LAN), or a wide area network (WAN).

Elements of the present disclosure may be implemented in the data processing system 102 and the storage device 104 in connection with the network 108. For example, the data processing system 102 may obtain both historical energy-usage data and current energy-usage measurements for the building 106 from the storage device 104 to generate an energy usage baseline. The building 106 is a location where energy usage is monitored. For example, an operator of the building 106 may desire to have current energy usage modeled for comparison with future energy usage.

The data processing system 102 may obtain historical energy-usage data for the building 106 from historical utility data. For example, the data processing system 102 may obtain the historical energy-usage data about energy usage at the building 106 for a prior period of time from information about utility bills or utility invoices stored in a database within the storage device 104.

The data processing system 102 also obtains historical temperature data for a location where the building 106 is located during the period of time for the historical utility data. For example, the data processing system 102 may obtain an average, high, and/or low temperature(s) for days, week, months, and/or years within the period of time covered by the historical energy-usage data. The data processing system 102 may obtain this historical temperature data from one or more weather databases (e.g., a national weather service) that store information about temperature at different locations.

The data processing system 102 combines historical energy-usage data with the historical temperature data to generate a historical energy usage baseline. This historical energy usage baseline represents energy usage at the building as a function of temperature for a previous period of time.

Disclosed embodiments recognize that data obtained for a previous period of time at the building 106 may not be accurate. For example, the historical energy-usage data may not be accurate. Changes at the building 106 may affect energy consumption. For example, equipment maintenance, energy usage habits, seasonal variations, building traffic and use, building repair, and maintenance issues may change the amount of energy consumed at the building 106. Disclosed embodiments modify this historical energy usage baseline to account for changes in energy usage.

To account for changes in energy usage, the data processing system 102 obtains energy-usage measurements from the building 106 via the network 108 during a monitoring period. For example, the building 106 receives electrical energy from an energy source (e.g., power lines 110). Sensor 112 measures an amount of energy received at the building 106. A data processing system 114 at the building 106 receives the energy-usage measurements from the sensor 112 and sends the energy-usage measurements to data processing system 102 via the network 108.

The data processing system 102 also obtains temperature data for the location where the building 106 is located for the monitoring period. For example, the data processing system 102 may obtain an average, high, and/or low temperature(s) for days, week, and/or months that the energy-usage measurements were obtained. The data processing system 102 may obtain this temperature data from one or more weather databases (e.g., a national weather service) that store information about temperature at different locations or from a temperature sensor 116 located at the building 106.

The data processing system 102 combines the energy-usage measurements and the temperature data to generate a current energy usage baseline as a function of temperature. This current energy usage baseline spans a temperature range experienced during the monitoring period. The data processing system 102 generates a correction factor for the historical energy usage baseline based on differences with the current energy usage baseline for the temperature range experienced during the monitoring period. The data processing system 102 applies this correction factor for the entire range of temperatures of the historical energy usage baseline to generate an adjusted energy usage baseline. Because the energy usage measured during the monitoring period is applied to adjust the historical energy usage baseline, the actual amount of time needed to monitor energy usage at the building 106 is significantly reduced. For example, energy-usage measurements for months, weeks, or even days may be applied to historical data covering a year or more to adjust or correct the historical data for current operating conditions at the building 106. This correction produces accurate results for an energy usage baseline while reducing the actual amount of time needed to monitor energy usage at the building 106.

Figure 7:
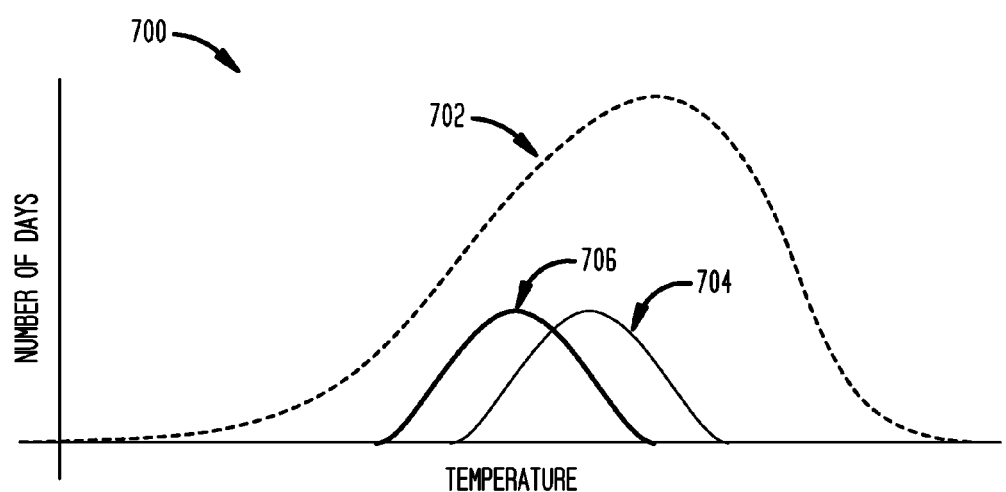
FIG. 7 illustrates a graph of a historical temperature distribution, baseline temperature distribution, and control data temperature distribution in accordance with various embodiments of the present disclosure.

In various embodiments of the present disclosure, the energy monitoring environment 100 uses a historical temperature distribution to improve measurement and verification of energy usage predictions. For example, the data processing system 102 may use the temperature data for a location where the building 106 is located to generate a historical temperature distribution for the location. The historical temperature distribution is an identification of how frequently certain temperatures occur during a period of time. For example, the historical temperature distribution may be a distribution graph of daily temperatures and the number of days in a year. The daily temperature may be a high daily temperature, an average daily temperature, or a low daily temperature. The number of days may represent an actual prior year or an average number of days in a year from several previous years' worth of temperature data. Temperature distribution 702 in FIG. 7 provides an illustration of one example of a historical temperature distribution. As used herein, the period of time is commonly referred to as a year, as most consumers are interested in annual savings and use annual budgeting schemes. However, this period of time may be any suitable time period for which energy usage savings are monitored.

In various embodiments, the data processing system 102 weights the energy-usage data received from the sensor 112 using the historical temperature distribution. For example, the data processing system 102 may weight energy-usage measurements received from the sensor 112 in generating a baseline for energy usage at the building 106. In some embodiments, this weighting of the energy-usage data may be used in addition to the techniques described above using a correction factor to generate a current energy usage baseline. In other embodiments, the weighting of the energy-usage data may be used in place of the above-described techniques that use the correction factor to generate a current energy usage baseline. In other examples, the data processing system 102 may weight data collected after enactment of energy-saving measures at the building 106. For example, after generating the baseline for energy usage at the building 106, an energy management system (EMS) may be implemented at the building 106 to efficiently manage energy usage at the building. The data processing system 102 may weight the post-energy-saving measures data (e.g., EMS control data) to more accurately estimate an energy usage after using energy saving products and systems. Various embodiments use the temperature distribution weighting of both pre and post enactment of energy-saving measures data. In other embodiments, only one of the pre and post enactment of energy-saving measures data may be weighted.

In various embodiments, the data processing system 102 may also weight a difference between the baseline energy usage for the building 106 and an expression for the post-energy-saving-measures data using the historical temperature distribution. In other words, the data processing system 102 may weight the expected reduction in energy usage as a result of enactment of energy-saving measures the energy-usage data received from the sensor 112. Using the weighted data, the data processing system 102 may more accurately estimate an amount of reduction in energy usage after the enactment of energy-saving measures.

The description of energy monitoring environment 100 in FIG. 1 is intended as an example and not as a limitation on the various embodiments of the present disclosure. For example, the energy monitoring environment 100 may include additional server computers, client devices, and other devices not shown. In some embodiments, all or some of the functionality of the data processing system 102 may be implemented at the building 106 by the data processing system 114. In some embodiments, all or some of the functionality of the data processing system 102 may be implemented in one or more server computers in a cloud computing environment within network 108.

In other embodiments, energy monitoring may occur for any different type of energy consumption unit. For example, various embodiments may be applied to any type of building or home, as well as subsystems within the building or home. For example, without limitation, energy usage baselines may be generated for lighting systems, HVAC systems, and/or other types of building subsystems, as well as individual components within the subsystems. Additionally, in some embodiments, the baselines may be generated for other types of energy or utilities. For example, the data processing system 102 may generate and adjust baselines for water consumption, natural gas, gasoline, and/or any other type of utility or energy resource.

Figure 2:
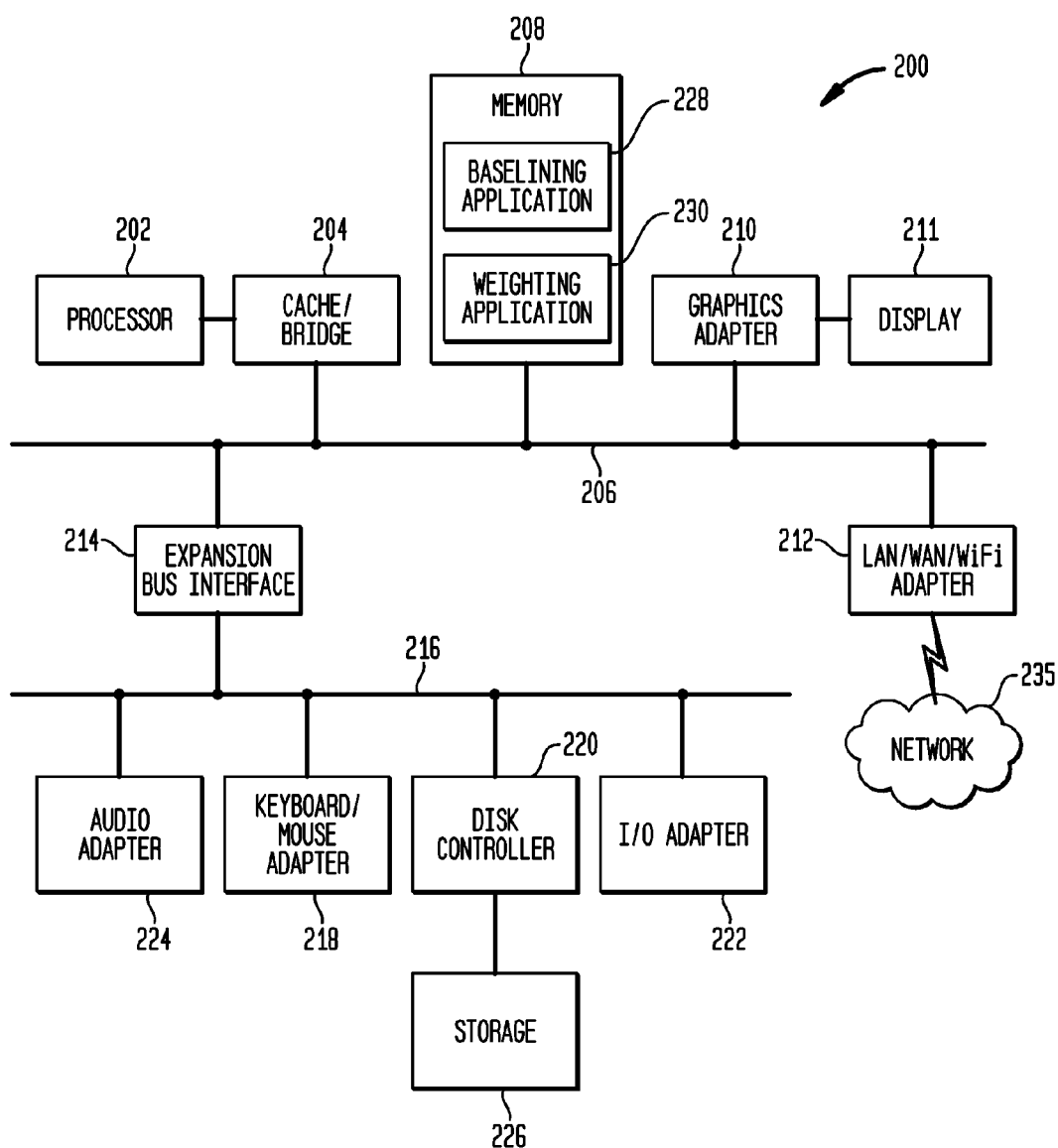
FIG. 2 illustrates a block diagram of a data processing system in which various embodiments of the present disclosure are implemented.

FIG. 2 depicts a block diagram of a data processing system 200 in which various embodiments are implemented. The data processing system 200 includes a processor 202 connected to a level two cache/bridge 204, which is connected in turn to a local system bus 206. The local system bus 206 may be, for example, a peripheral component interconnect (PCI) architecture bus. Also connected to local system bus 206 in the depicted example are a main memory 208 and a graphics adapter 210. The graphics adapter 210 may be connected to a display 211.

Other peripherals, such as a local area network (LAN)/Wide Area Network/Wireless (e.g. WiFi) adapter 212, may also be connected to local system bus 206. An expansion bus interface 214 connects the local system bus 206 to an input/output (I/O) bus 216. The I/O bus 216 is connected to a keyboard/mouse adapter 218, a disk controller 220, and an I/O adapter 222. The disk controller 220 may be connected to a storage 226, which may be any suitable machine-usable or machine-readable storage medium, including, but not limited to nonvolatile, hard-coded type mediums such as read only memories (ROMs), or erasable, electrically programmable read only memories (EEPROMs), magnetic tape storage, and user-recordable type mediums, such as floppy disks, hard disk drives, and compact disk read only memories (CD-ROMs) or digital versatile disks (DVDs), and other known optical, electrical, or magnetic storage devices.

Also connected to the I/O bus 216 in the example shown is an audio adapter 224, to which speakers (not shown) may be connected for playing sounds. The keyboard/mouse adapter 218 provides a connection for a pointing device (not shown), such as a mouse, trackball, trackpointer, etc. In some embodiments, the data processing system 200 may be implemented as a touch screen device, such as, for example, a tablet computer or touch screen panel. In these embodiments, elements of the keyboard/mouse adapter 218 may be implemented in connection with the display 211.

In various embodiments of the present disclosure, the data processing system 200 is a computer in the energy monitoring environment 100, such as the data processing system 102 or the data processing system 114. The data processing system 200 implements a baselining application 228. The baselining application 228 is a software application that generates a baseline for energy usage at a building. For example, baselining application 228 includes program code for generating a historical energy usage baseline, which identifies a correction factor for the historical energy usage baseline from measured energy-usage data and generates an adjusted energy usage baseline.

The data processing system 200 obtains data for energy usage and temperature for a building. For example, twelve months of utility bills have a monthly energy usage and average daily temperature for the months corresponding to the utility bills. The data processing system 200 may obtain the data for energy usage and temperature from various databases. For example, the energy-usage data may be obtained from a server of a utility service provider, and the temperature data may be obtained from a server of a national weather service. In another example, the data processing system 200 may receive the energy usage and temperature data from another system or process or from a user entry. The data processing system 200 plots this data as a plurality of data points for energy and temperature. The data processing system 200 performs a regression analysis on the data points to generate a function of the mathematical relationship between temperature and energy usage. For example, this regression analysis may be a linear regression or a polynomial regression. This mathematical relationship between temperature and energy usage is the historical energy usage baseline.

The data processing system 200 also receives measurements of current energy usage for the building. For example, the data processing system 200 may receive energy-usage measurements from an energy sensor (e.g., an electricity meter) located at the building. These energy-usage measurements may be for different periods of time including one or more months, weeks, days, hours, and/or minutes. The data processing system 200 receives values for temperature in the location where the building is located for the measurements of current energy usage. For example, the values for temperature may be an average temperature during the period of time that a measurement of energy usage was taken. The data processing system 200 may obtain the values for temperature from a server of a national weather service or a temperature sensor at the building. In some embodiments, the temperature values for the current energy usage are obtained from a same source as the temperature values for the historical energy usage baseline. In this example, the use of a same temperature data source may improve consistency between the historical data and the current data. The current energy-usage measurements and temperature values are associated as energy usage and temperature data point pairs.

As the energy usage and temperature data is received, the data processing system 200 performs a regression analysis on the energy usage and temperature data point pairs to generate a function for the current relationship between temperature and energy usage for the building as a current energy usage baseline. With each data point pair received, the modeling of the current energy usage baseline for the building becomes more accurate. Given that the historical energy usage baseline involves measurements from a larger period of time (e.g., a year) than the current energy usage baseline (e.g., a few days or weeks), it is likely that the entire temperature range for the building may not be covered in the current energy usage baseline. In other words, the temperature range for the current energy usage baseline may only cover a portion of the temperature range of the historical energy usage baseline.

The data processing system 200 calculates a difference between the current energy usage baseline and the historical energy usage baseline to identify a correction factor to apply to the historical energy usage baseline to generate an adjusted energy usage baseline for the entire temperature range. In one illustrative example, the data processing system 200 performs an operation to integrate the function for the historical energy usage baseline and the function for the current energy usage baseline over the portion of the temperature range covered by the current energy usage baseline. In other words, the data processing system 200 calculates the area under the curve for both the historical energy usage baseline and the current energy usage baseline for the portion of the temperature range. The data processing system 200 subtracts the integral of the function for the current energy usage baseline from the integral of the function for historical energy usage baseline to obtain a difference. The data processing system 200 utilizes this difference to form a correction factor as a multiplier and/or offset for the historical energy usage baseline. For example, the correction factor may be a multiplier, offset, and/or function used to scale, shift, or otherwise adjust the historical energy usage baseline.

The data processing system 200 applies this correction factor to the historical energy usage baseline to generate an adjusted energy usage baseline. This adjusted energy usage baseline accounts for changes and inaccuracies in the historical energy usage baseline. By only needing to obtain measurements that cover a portion of the temperature range in the historical energy usage baseline, disclosed embodiments provide time cost savings in modeling energy usage. Additionally, disclosed embodiments apply detected changes detected in the energy usage patterns to the entire baseline producing an accurate model of the energy usage.

In order to accurately model the energy usage, disclosed embodiments use measurements that span a threshold temperature range of the historical energy usage baseline. For example, the data processing system 200 may continue to receive and use energy-usage measurements until the threshold temperature range is reached. While more energy-usage measurements and a greater temperature range may produce more accurate results, disclosed embodiments recognize that the overlap between temperature ranges may be based on the difference between the current energy usage baseline and the historical energy usage baseline. For example, the larger the correction factor for the historical energy usage baseline, the more overlap between temperatures is helpful to achieve sufficient accuracy. When the correction factor is smaller, the amount of overlap between temperatures of the current and historical data may be less to achieve similar levels of accuracy in the adjusted energy usage baseline.

Upon generation of the adjusted energy usage baseline, the data processing system 200 may utilize the adjusted energy usage baseline to generate estimates of future energy savings. For example, the data processing system 200 may compare estimated energy usage using energy saving products and systems to the adjusted energy usage baseline to produce accurate results for future energy savings.

In addition to or in lieu of the above-described methods for generating the adjusted energy usage baseline, various embodiments of the present disclosure utilize at least two methods of improving accuracy of energy-usage measurement and verification by weighting the available data by the actual temperature distribution. This use of the actual temperature distribution for a location may be in place of the assumption that temperatures occur in a uniform distribution throughout a whole year. For example, unless a whole year's worth of energy-usage measurement data is available, a regression analysis of the available energy usage and temperature data points may give more weight to the temperature data points that happened to have been sampled. Various embodiments of the present disclosure generate and utilize a distribution of temperatures that have actually occurred in the location. For example, various embodiments weight energy-usage data by the actual historical temperature distribution to achieve an improved relationship of energy usage versus temperature.

In these embodiments, the data processing system 200 implements a weighting application 230. The weighting application 230 is a software application that generates and applies a weighting to energy-usage data based on temperature distribution. For example, weighting application 230 may include program code for generating or receiving a historical temperature distribution, weighting baseline energy-usage data, weighting post-energy-savings-measures data, weighting a difference between a baseline and measured energy-usage data, and/or estimating a reduction in energy usage using weighted data.

In various embodiments, the data processing system 200 generates the temperature distribution for the location and weights or re-weights, if already weighted, energy-usage data by the actual temperature distribution of the location's whole year historical experience. This weighting or re-weighting may occur prior to applying whatever regression algorithms are to be used to estimate or project the baseline or post-energy-savings-measures expression. This weighting of the actual or "raw" measurement data may lead to a quicker projection of the estimated energy usage as a function of temperature. For example, the data processing system 200 may weight energy-usage measurements covering a subset of the temperature range for the location based on temperature distribution to form data points of weighted energy usage and corresponding temperature. The data processing system 200 may then perform a regression analysis on the data points to identify an expression that represents energy usage as a function of temperature. This weighting of the raw data may be utilized for either or both of the pre-energy-savings-measures data (e.g., data used to generate the baseline) and the post-energy-savings-measures data (e.g., EMS control data).

Once regression trends are established by whatever data, algorithms or methods, for the baseline and post-energy-savings-measures expressions, these two relationships are compared across the temperature range to determine expected energy savings. For example, the difference, at a given temperature, between the baseline and the post-energy-savings-measures expression represents the amount of energy savings that may be expected at that temperature. The data processing system 200 may calculate this difference as the difference between the areas under the two curves evaluated with a definite Riemann integral.

Embodiments of the present disclosure weight this difference based on the temperature distribution. For example, embodiments of the present disclosure recognize that the number of days or months with a 60° F. average temperature occurs more or less often than the days or months with 50° F. days for a given location. Therefore, a more accurate total difference for a whole year may be obtained by weighting the difference by temperature between any two regressions. In various embodiments of the present disclosure, the data processing system 200, when comparing baseline to post-measures regressions of energy versus temperature, weights the difference between the regressions by the actual temperature distribution of the location's whole year historical experience when determining a total year's savings. The data processing system 200 may also utilize the temperature distribution to determine the annual energy usage and/or savings. For example, the data processing system 200 may use the expected energy usage or savings for the different temperatures from the regressions and the number of days each temperature is expected to calculate the annual energy usage and/or savings. This weighting of the difference may lead to a quicker assessment of the energy savings expected in a year and thereby shorten the amount of time measurements are needed. This weighting of the difference may also lead to a more accurate assessment of energy savings.

Those of ordinary skill in the art will appreciate that the hardware depicted in FIG. 2 may vary for particular implementations. For example, other peripheral devices, such as an optical disk drive and the like, also may be used in addition to or in place of the hardware depicted. The depicted example is provided for the purpose of explanation only and is not meant to imply architectural limitations with respect to the present disclosure.

One of various commercial operating systems, such as a version of Microsoft Windows™, a product of Microsoft Corporation located in Redmond, Wash., may be employed if suitably modified. The operating system is modified or created in accordance with the present disclosure as described, for example, to implement the baselining application 228.

LAN/WAN/Wireless adapter 212 may be connected to a network 235 which may be any public or private data processing system network or combination of networks, as known to those of skill in the art, including the Internet. Data processing system 200 may communicate over network 235 to one or more computers, which are also not part of data processing system 200, but may be implemented, for example, as a separate data processing system 200.

Figure 3:
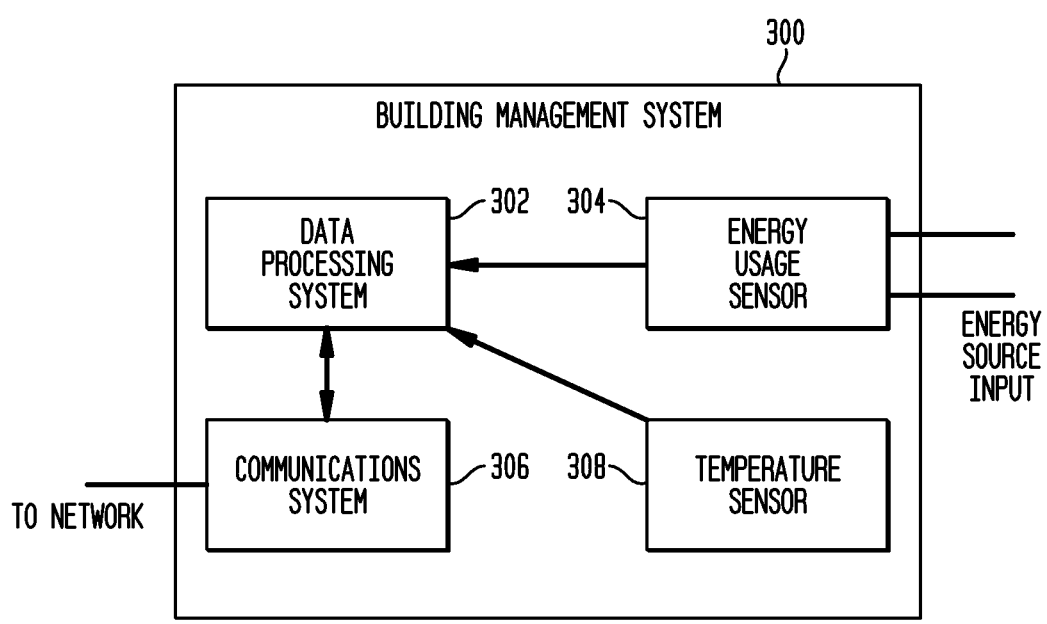
FIG. 3 illustrates a block diagram of a building management system in which various embodiments of the present disclosure are implemented.

FIG. 3 illustrates a block diagram of a building management system 300 in which various embodiments are implemented. In these illustrative examples, the building management system 300 implements one or more functions within a building, such as the building 106 in FIG. 1. For example, building management system 300 may be an example of one embodiment of the sensor 112, the data processing system 114, the temperature sensor 116, and/or the data processing system 200. For example, the building management system 300 may include building automation functions, energy usage monitoring functions, energy-management-system functions, and temperature monitoring functions within the building.

The building management system 300 includes a data processing system 302 operably connected to an energy usage sensor 304, a communications system 306, and a temperature sensor 308. The energy usage sensor 304 obtains measurements of energy received from an energy source as energy usage for the building. The energy usage sensor 304 may be an electrical meter, smart meter, and/or any other type of energy usage sensor. The energy usage sensor 304 sends the measurements of energy usage to the data processing system 302. Data processing system 302 includes time stamping information with the measurements of energy received. This time stamping information may be used to associate the energy-usage measurements with temperature values.

The data processing system 302 may also receive temperature values from the temperature sensor 308. The temperature sensor 308 may be a thermometer associated with the building that measures outdoor temperature at the building. Data processing system 302 includes time stamping information with the temperature values received. This time stamping information may be used to associate the temperature values with energy-usage measurements.

In some embodiments, the data processing system 302 implements the baselining application 228. For example, the data processing system 302 may perform the functions for generating a historical energy usage baseline, identifying a correction factor for the historical energy usage baseline from measured energy-usage data, and generating an adjusted energy usage baseline. For example, the data processing system 302 may receive the historical data via the communications system 306 from a network-connected storage device and generate the correction factor and adjusted energy usage baseline based on measurements received from the energy usage sensor 304 and the temperature sensor 308. In another example, the data processing system 302 may receive the temperature values from an external source, for example, a same source that the temperature values for the historical data were received.

In some embodiments, the data processing system 302 may implement the weighting application 230. For example, the data processing system 302 may perform the functions for generating or receiving a historical temperature distribution, weighting baseline energy-usage data, weighting a difference between a baseline and measured energy-usage data, and/or estimating a reduction in energy usage using weighted data. In this example embodiment, the data processing system 302 may receive the historical temperature distribution or temperature data for generating the temperature distribution via the communications system 306 from a network connected storage device. In this example embodiment, the data processing system 302 may perform the weighting based on measurements received from the energy usage sensor 304.

In other embodiments, the data processing system 302 sends, via the communications system 306, the measurements of energy usage with the time stamping information and the temperature values with the time stamping information for processing by an external device, for example, the data processing system 102 in FIG. 1. In some embodiments, the temperature sensor 308 may not be included within building management system 300. Thus, the data processing system 302 may only send the measurements of energy usage.

In various embodiments, the energy usage sensor 304 measures energy usage by one or more subsystems and/or components within the building management system 300. For example, without limitation, the energy usage sensor 304 may measure energy usage by lighting systems, HVAC systems, and/or other types of subsystems within building management system 300, as well as individual components within the subsystems. The data processing system 302 may process or send these energy-usage measurements to identify energy usage baselines or comparisons for the subsystems and/or components within the building management system 300.

Figure 4:
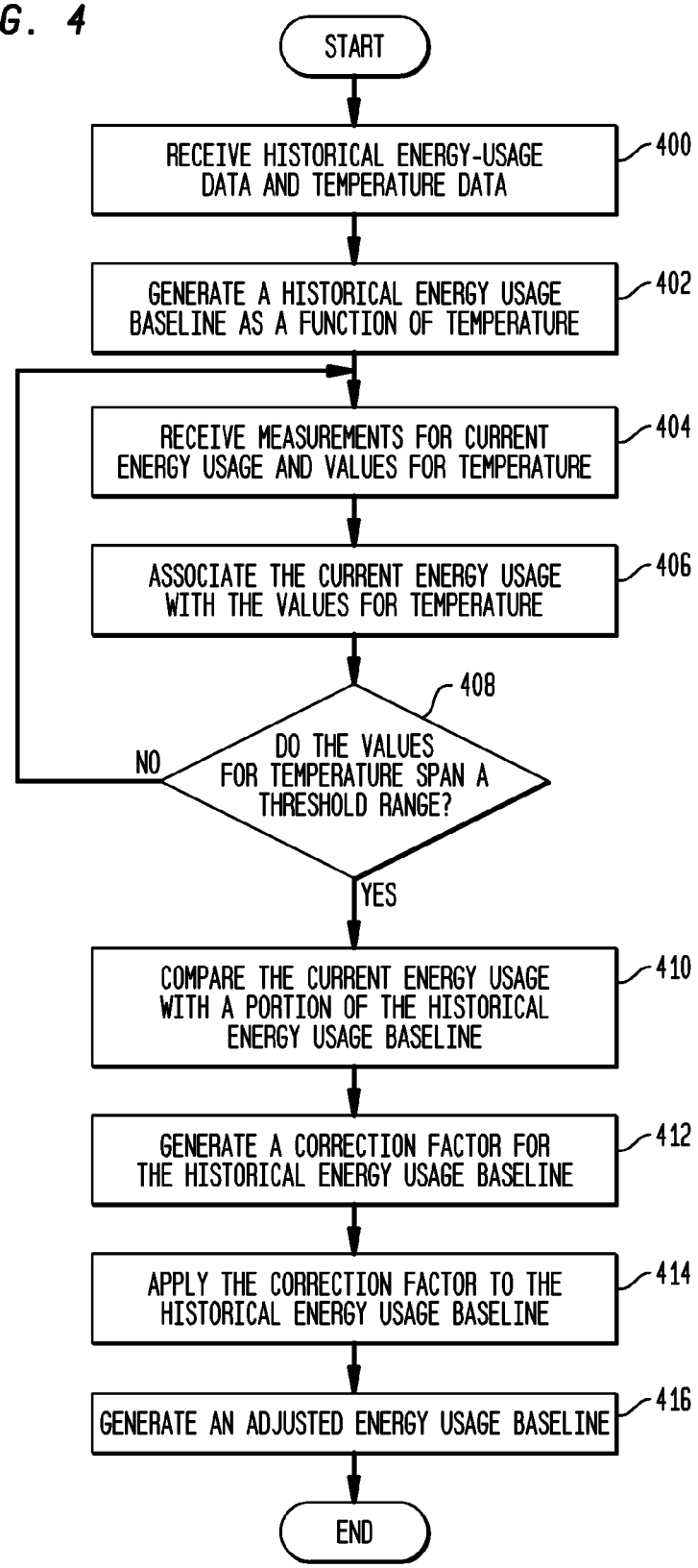
FIG. 4 depicts a flowchart of a process for generating an adjusted energy usage baseline in accordance with disclosed embodiments.

FIG. 4 depicts a flowchart of a process for generating an adjusted energy usage baseline in accordance with disclosed embodiments. This process may be performed, for example, in one or more data processing systems, such as, for example, the data processing system 200, configured to perform acts described below, referred to in the singular as "the system." The process may be implemented by executable instructions stored in a non-transitory computer-readable medium that cause one or more data processing systems to perform such a process. For example, baselining application 228 may comprise the executable instructions to cause one or more data processing systems to perform such a process.

The process begins with the system receiving historical energy-usage data and temperature data (step 400). In step 400, the historical energy-usage data may be received from a server of a utility service provider and the historical temperature data may be received from a server of a national weather service. In another example, the data processing system 200 may receive the historical energy usage and temperature data from another system or process or from a user entry. The system generates a historical energy usage baseline as a function of temperature (step 402). In step 402, the data processing system 200 may generate the historical energy usage baseline from a regression analysis performed on data points for temperature and energy.

The system receives measurements for current energy usage and values for temperature (step 404). In step 404, the data processing system 200 may receive the measurements for current energy usage from the energy usage sensor 304 via the data processing system 302 and the communications system 306 in the building management system 300. In step 404, the data processing system 200 may receive the values for temperature from a same temperature source as the historical temperature data. In another example, the data processing system 200 may receive the energy usage and temperature data from another system or process or from a user entry.

The system associates the current energy usage with the values for temperature (step 406). In step 406, the data processing system 302 may compare time stamp information for the current energy-usage data to periods of time for the values for temperature. The data processing system 302 may calculate an average temperature for a period of time for the current energy-usage data.

The system determines whether the values for temperature span a threshold range of the historical energy usage baseline (step 408). In step 408, the data processing system 200 determines whether sufficient data has been received to accurately adjust the historical energy usage baseline. For example, the data processing system 200 may determine an amount of difference between the current energy-usage data and historical usage data. The larger the difference the larger the threshold range of the temperature overlap between the current energy-usage data and historical usage data. If the values for temperature do not span the threshold range, the system returns to step 404 and continues to receive measurements for current energy usage and values for temperature.

When the values for temperature span the threshold range, the system compares the current energy usage with a portion of the historical energy usage baseline (step 410). In step 410, the portion of the historical energy usage baseline is the portion where the temperature ranges for the historical data and the current energy-usage data overlaps. In comparing the current energy usage with a portion of the historical energy usage baseline, the data processing system 200 may identify a difference between the historical energy usage baseline and the current energy usage for the temperature range.

The system generates a correction factor for the historical energy usage baseline (step 412). In step 412, the data processing system 302 may generate the correction factor as a multiplier, offset, and/or function based on the difference between the historical energy usage baseline and the current energy usage for the temperature range.

The system applies the correction factor to the historical energy usage baseline (step 414). In step 414, for example, the data processing system 200 may multiply, scale, or otherwise adjust the historical energy usage baseline based on the correction factor. The system generates an adjusted energy usage baseline (step 416). In step 416, the data processing system 200 applies the correction factor to the entire temperature range of the historical energy usage baseline to generate the adjusted energy usage baseline. The adjusted energy usage baseline accounts for energy usage changes that may have occurred. The data processing system 200 may use this adjusted energy usage baseline to generate an estimated future energy savings for energy savings products and systems to be installed. This adjusted energy usage baseline may be stored and/or displayed to a user as a tangible output, for example, by data processing system 200. Thereafter, the process ends.

Figure 5:
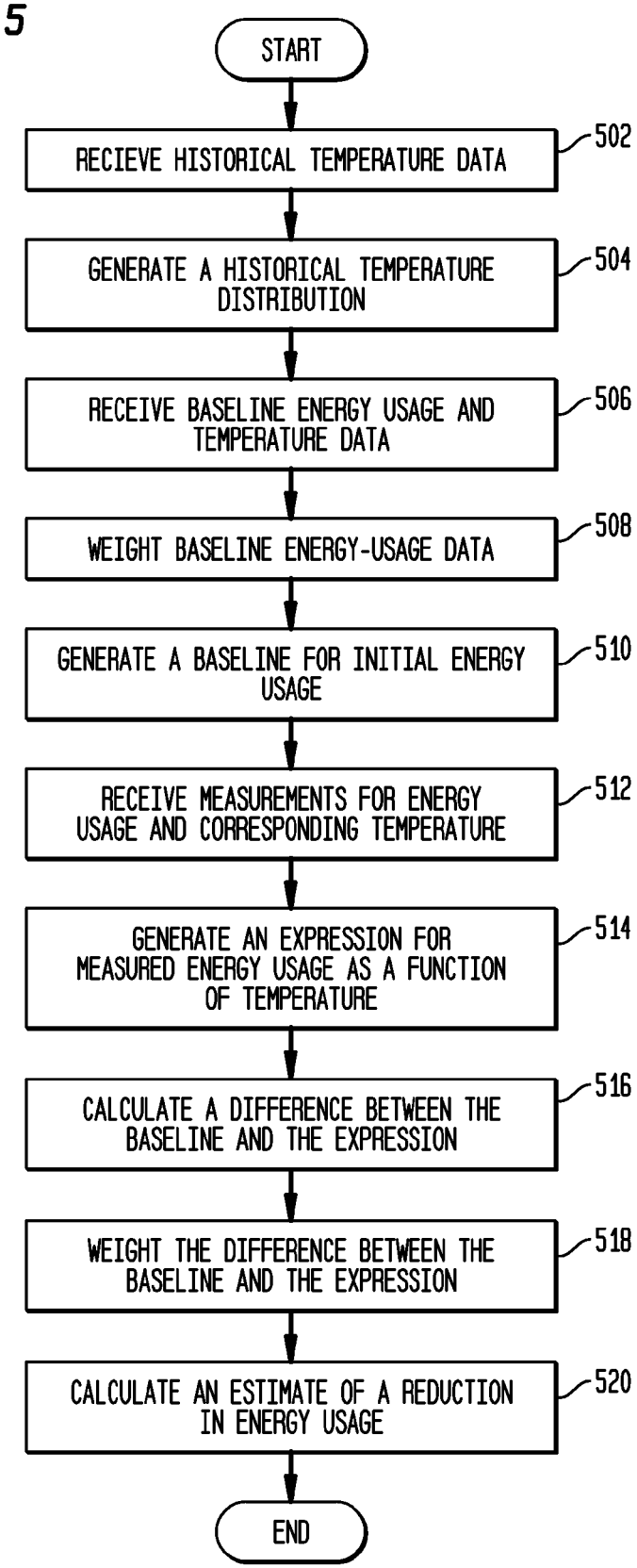
FIG. 5 depicts a flowchart of a process for temperature weighting in energy-usage measurements in accordance with disclosed embodiments.

FIG. 5 depicts a flowchart of a process for temperature weighting in energy usage estimates in accordance with disclosed embodiments. This process may be performed, for example, in one or more data processing systems, such as, for example, the data processing system 200, configured to perform acts described below, referred to in the singular as "the system." The process may be implemented by executable instructions stored in a non-transitory computer-readable medium that cause one or more data processing systems to perform such a process. For example, weighting application 230 may comprise the executable instructions to cause one or more data processing systems to perform such a process.

The process begins with the system receiving historical temperature data (step 502). For example, in step 502, the temperature data includes temperature values for a previous period of time at a location where a building is located. The system generates a historical temperature distribution (step 504). For example, in step 504, the system may generate a distribution for a number of days in a year that different temperatures occur. In other embodiments, the historical temperature distribution may already have been generated, thus, the system may receive the generated historical temperature distribution.

The system receives baseline energy usage and temperature data (step 506). For example, in step 506, the system may receive an initial set of measurements for energy usage at the building and corresponding temperature values. The system may receive the energy-usage measurements from the sensor 112 and the temperature data from the temperature sensor 116 in FIG. 1. In other examples, the system may identify the temperature values from a database or website, such as the national weather service. In these examples, the corresponding temperatures are the daily temperature for the day the energy usage measurement was measured.

The system weights baseline energy-usage data (step 508). For example, in step 508, the system may weight each measurement in the initial set based on the number of days that the temperature corresponding to that measurement occurred during the period of time according to the historical temperature distribution.

The system generates a baseline for initial energy usage (step 510). For example, in step 510, the system may identify a plurality of pairs of weighted energy usage and temperature data points by applying the weighting to the each measurement. The system may then generate the baseline by performing a regression analysis (e.g., a linear regression, a polynomial regression, etc.) on the plurality of pairs of data points.

The system receives measurements for energy usage and corresponding temperature (step 512). For example, in step 512, these measurements for energy usage are from after the baseline was calculated and after enactment of energy-saving measures such, as an EMS. The system may receive the energy-usage measurements from the sensor 112 and the temperature data from the temperature sensor 116 in FIG. 1. In other examples, the system may identify the temperature values from a database or website, such as the national weather service. In these examples, the corresponding temperatures are the daily temperature for the day the energy usage measurement was measured.

The system generates an expression for measured energy usage as a function of temperature (step 514). For example, in step 514, the system may perform a regression analysis (e.g., a linear regression, a polynomial regression, etc.) on data points for post-energy-saving-measures energy-usage measurement and corresponding temperature. As part of this step, the system may also weight the post-energy-saving-measures energy-usage measurements prior to performing the regression analysis and perform the regression on the weighted data.

The system calculates a difference between the baseline and the expression (step 516). For example, in step 516, the system may integrate the baseline and the expression and then subtract the area under the curve of the baseline from the area under the curve of the expression. The resulting difference is a function of temperature.

The system weights the difference between the baseline and the expression (step 518). For example, in step 518, the system may weight the difference per temperature based on the number of days the temperature occurred during the period of time.

The system calculates an estimate of a reduction in energy usage (step 520). For example, in step 520, the system may calculate the estimate using the weighted difference. The reduction in energy usage may be an amount of energy savings at the building as a result of energy-saving measures enacted at the building between a time when the baseline for initial energy usage was calculated and a time when the measurements for energy usage at the building were measured.

Of course, those of skill in the art will recognize that, unless specifically indicated or required by the sequence of operations, certain steps in the processes described above may be omitted, performed concurrently or sequentially, or performed in a different order.

Figure 6A:
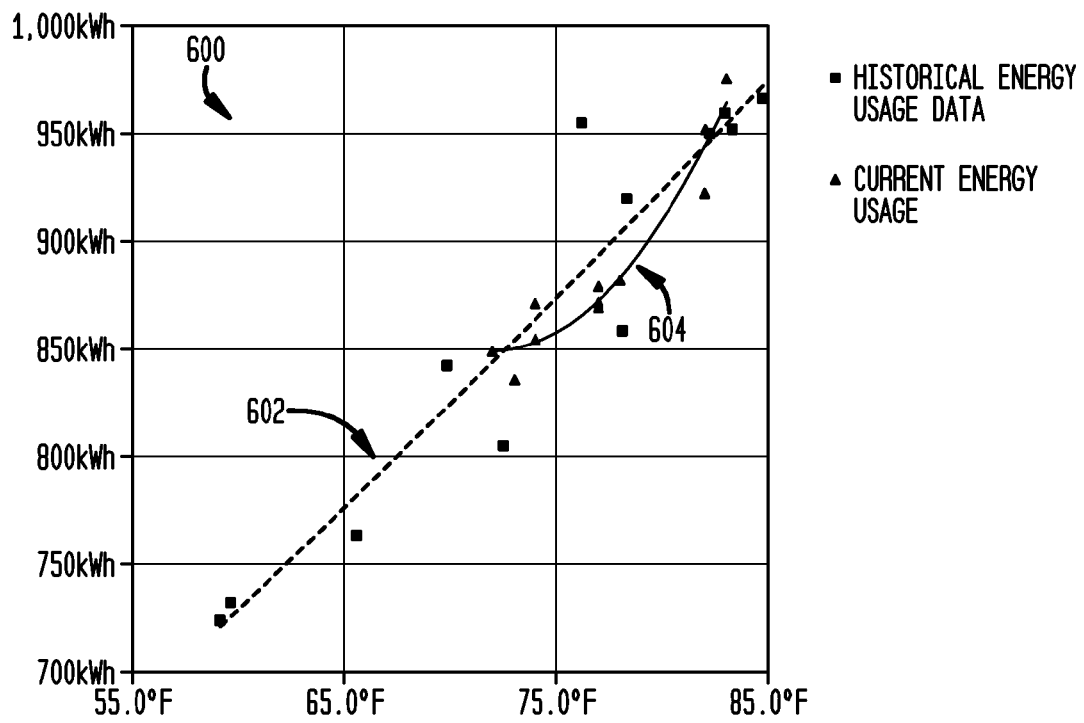
FIGS. 6A and 6B illustrate graphs of energy usage baselines generated in accordance with various embodiments of the present disclosure.
Figure 6B:
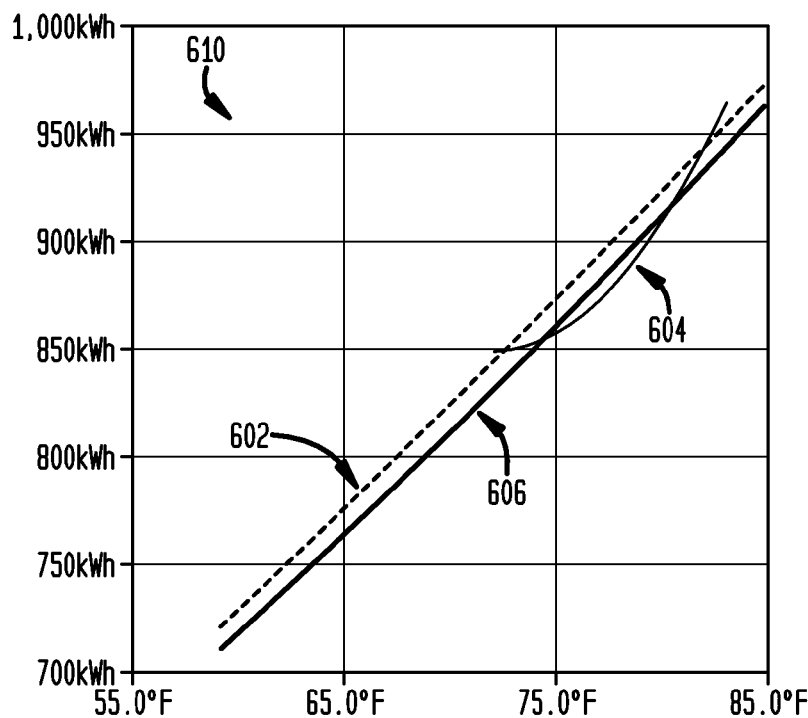

FIGS. 6A and 6B illustrate graphs of energy usage baselines generated in accordance with various embodiments of the present disclosure. Graph 600 in FIG. 6A illustrates the historical energy usage baseline 602 as a function of temperature generated from data points for historical energy-usage data. In graph 600, the square shaped points represent data point pairs for historical energy usage and temperature data point pairs plotted on graph 600. For example, the data processing system 200 may identify a value for energy usage and a value for average temperature for a month and plot the data point pairs on graph 600. The data processing system 200 may perform a regression analysis on the data point pairs to generate the function for the historical energy usage baseline 602 plotted on graph 600. In this illustrative example, the function for historical energy usage baseline 602 is energy usage=$0.0189*t^2+7.1075*t+233.56$ where t is the value for temperature.

Also included in graph 600 is a current energy usage baseline 604. In graph 600, the triangle-shaped points represent data point pairs for energy-usage measurements and temperature data point pairs plotted on graph 600. For example, the data processing system 200 may identify a value for a current energy usage measurement and a value for average temperature during the period of time the energy usage was measured and plot the data point pairs on graph 600. As depicted, the data point pairs for the current energy usage baseline 604 only span a portion of the temperature range of the historical energy usage baseline 602. For example, the temperature range of the historical energy usage baseline 602 is from about 69° F. to about 84° F., while the temperature range of the current energy usage baseline 604 is from about 72° F. to about 82° F. The data processing system 200 may perform a regression analysis on the data point pairs to generate the function for the current energy usage baseline 604 plotted on graph 600. In this illustrative example, the function for the current energy usage baseline 604 is energy usage=$0.9417*t^2+135.5*t+5722.8$ where t is the value for temperature.

Graph 610 in FIG. 6B illustrates an adjusted energy usage baseline 606 generated based on historical energy usage baseline 602 and current energy usage baseline 604. For example, the data processing system 200 may calculate a difference between historical energy usage baseline 602 and current energy usage baseline 604 for the temperature range spanned by current energy usage baseline 604. In this example, the difference is averaged over the temperature range spanned by current energy usage baseline 604 to identify a correction factor. The data processing system 200 scales the historical energy usage baseline 602 by the correction factor to generate the adjusted energy usage baseline 606. In this illustrative example, the function for the adjusted energy usage baseline 606 is energy usage=$0.0372*t^2+4.5172*t+313.57$ where t is the value for temperature. This adjusted energy usage baseline 606 may then be used to generate estimates of future energy usage savings. The graphs 600 and 610 may be stored and/or displayed to a user as a tangible output, for example, by the data processing system 200.

FIG. 7 illustrates a graph 700 of a historical temperature distribution 702, baseline temperature distribution 704, and control-data temperature distribution 706 in accordance with various embodiments of the present disclosure. In this illustrative embodiment, the historical temperature distribution 702 is a plot representing daily temperatures and the number of days in a year the daily temperature occurred. As illustrated, a majority of the days in the year have a temperature value (e.g. 70° F.) in the middle of the historical temperature distribution 702 with fewer numbers of days towards the opposite extreme temperatures (e.g., less than 30° F. or greater than 100° F.).

The baseline temperature distribution 704 is an example of a plot representing daily temperatures and the number of days during the baseline measurement period the daily temperature occurred. As illustrated, the range of temperatures and number of days in the baseline temperature distribution 704 is much less than in temperatures and days in the historical temperature distribution 702. This is because the sampling period for the baseline calculation is often less than a year. Customers are often not interested in waiting a year before implementing energy-saving measures. As illustrated in a comparison of the two curves (702 and 704), the higher temperatures in the baseline temperature distribution 704 occur more frequently during a year than the lower temperature values. Accordingly, embodiments of the present disclosure may weight energy-usage measurements for these higher temperatures more than other energy-usage measurements from the baseline date, despite the fact that there may be more of the other energy-usage measurements.

The control-data temperature distribution 706 is an example of a plot representing daily temperatures and the number of days during the control-data measurement period the daily temperature occurred. The control data is the energy usage and temperature data gathered post enactment of energy-saving measures. As illustrated, the range of temperatures and number of days in the control-data temperature distribution 706 is much less than in temperatures and days in the historical temperature distribution 702. This is because the sampling period for the control-data calculation is often less than a year. Customers are often not interested in waiting a year to determine whether energy-saving measures are, in fact, saving energy. As illustrated in a comparison of the two curves (702 and 706), the higher temperatures in the control-data temperature distribution 706 occur more frequently during a year than the lower temperature values. Accordingly, embodiments of the present disclosure may weight energy-usage measurements for these higher temperatures more than other energy-usage measurements from the baseline date, despite the fact that there may be more of the other energy-usage measurements.

Figure 8:
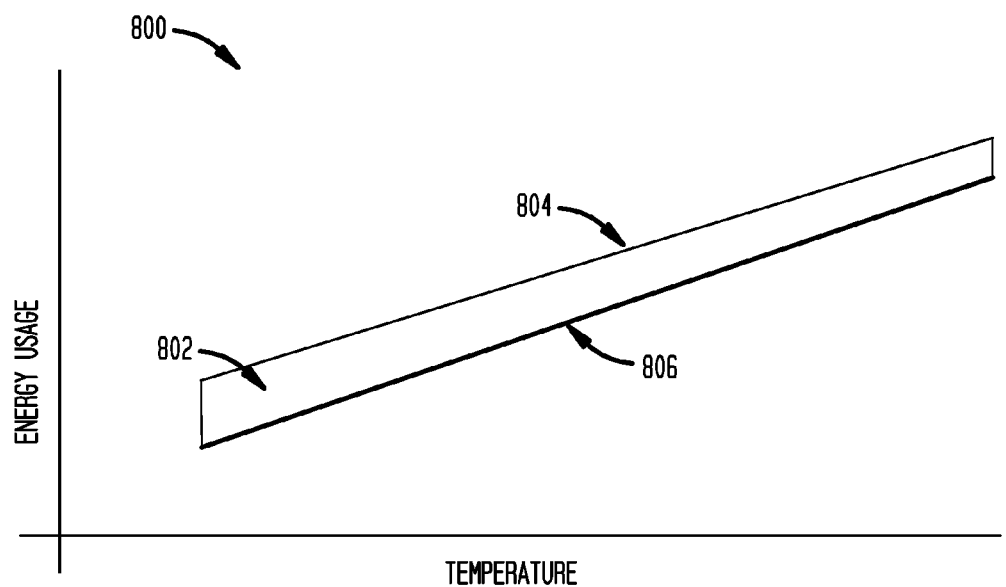
FIG. 8 illustrates a graph of a difference between baseline energy usage and measured energy usage in accordance with various embodiments of the present disclosure.

FIG. 8 illustrates a graph 800 of a difference 802 between baseline energy usage and measured energy usage in accordance with various embodiments of the present disclosure. As discussed above, once the data processing system 200 receives and weights the baseline and control data, the data processing system 200 performs a regression analysis to generate expressions for baseline energy usage and post-energy-savings-measures energy usage as a function of temperature.

In this illustrative embodiment, the baseline 804 is an example of a plot of the pre-energy-savings-measures energy usage as a function of temperature. The expression 806 is an example of a plot of the post-energy-savings-measures energy usage as a function of temperature. The difference 802 (shaded in grey) represents the difference between the area under the baseline 804 and the expression 806. This difference 802 is an amount of reduction in energy usage (e.g., energy savings) that can be expected as a function of temperature. The data processing system 200 may weight this difference 802 per temperature (e.g., for each temperature plotted in the graph 800) based on the number of times during the year that the temperature occurs. In other words, the difference 802 in energy usage is more reliable for use in annual calculations if the temperature for the energy usage difference occurs more frequently during a given year. The data processing system 200 may then calculate annual energy-usage reduction using this weighted difference and the historical temperature distribution 702. For example, the annual energy-usage reduction may be calculated as the number of days from the historical temperature distribution 702 times the weighted difference summed for each temperature.

Disclosed embodiments reduce an amount of time needed to establish an adjusted baseline of energy usage in a building while improving accuracy of the historical energy usage baseline. Disclosed embodiments reduce the data gathering time by combining historical energy-usage data with a sample of current energy-usage measurements from the location to provide an accurate energy usage baseline extended over a temperature range. Disclosed embodiments utilize this adjusted energy usage baseline to predict energy usage at a given temperature more accurately than the historical baseline would provide without requiring the long-term measurement period.

Disclosed embodiments use historical temperature distribution to weight energy-usage data in measurement and verification of energy usage predictions. For example, energy-usage data points at commonly occurring temperatures may be considered more reliable for measurement and verification. Similarly, energy-usage data points at extreme ends of the temperature distribution occur less frequently and likely have less impact on annual energy usage. Accordingly, disclosed embodiments improve the accuracy of measurement and verification of energy usage predictions and may reduce an amount of time required for data collection to obtain sufficiently accurate results.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 200 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method in a data processing system for temperature weighting in energy-usage measurements, the method comprising:
   identifying a number of days that each of a plurality of different temperatures occurred at a location during a period of time;
   identifying a baseline for initial energy usage at a building located in the location;
   receiving measurements for energy usage at the building;
   generating an expression for measured energy usage as a function of temperature by performing a regression analysis on the measurements for energy usage;
   identifying a difference between the baseline for initial energy usage and the expression for measured energy usage;
   generating a weighting for the difference between baseline energy usage and the measured energy usage at one or more temperatures based on the number of days the one or more temperatures occurred during the period of time; and
   adjusting the baseline using the weighting for operating subsystems of the building to reduce an amount of energy consumption.

2. The method of claim 1 further comprising:
   generating an estimate of energy usage at the building for the period of time based on the weighted difference.

3. The method of claim 2, wherein the period of time is a year and wherein the number of days is an average number of days in a year that that a daily temperature for the location is at a certain temperature degree.

4. The method of claim 1 further comprising:
   generating, using the weighted difference, an estimate of a reduction in energy usage at the building as a result of energy-saving measures enacted at the building between a time when the baseline for initial energy usage was calculated and a time when the measurements for energy usage at the building were measured.

5. The method of claim 1, wherein identifying the baseline for initial energy usage at the building comprises:
   receiving an initial set of measurements for energy usage at the building and corresponding temperature values;
   generating a weighting for each measurement in the initial set based on the number of days that a temperature associated with the each measurement occurred during the period of time;
   generating a plurality of pairs of weighted energy usage and temperature data points by applying the weighting to the each measurement; and
   generating the baseline for initial energy usage at the building by performing a regression analysis on the plurality of pairs of data points.

6. The method of claim 1, wherein generating the weighting for the difference comprises:
setting a weighting for a difference in energy usage at a temperature occurring more frequently during the period of time higher than a weighting for a difference in energy usage at a temperature occurring less frequently during the period of time.

7. The method of claim 1, wherein identifying the number of days that each of the plurality of different temperatures occurred at the location during the period of time comprises:
receiving historical temperature data comprising temperature values for a previous period of time at the location where the building is located; and
generating a historical temperature distribution for the number of days in a year that the different temperatures occur.

8. A data processing system configured to temperature weight in energy-usage measurements, the data processing system comprising:
a storage device comprising a weighting application;
an accessible memory comprising instructions of the weighting application; and
a processor configured to execute the instructions of the weighting application to:
identify a number of days that each of a plurality of different temperatures occurred at a location during a period of time;
identify a baseline for initial energy usage at a building located in the location;
receive measurements for energy usage at the building;
generate an expression for measured energy usage as a function of temperature by performing a regression analysis on the measurements for energy usage;
identify a difference between the baseline for initial energy usage and the expression for measured energy usage;
generate a weighting for the difference between baseline energy usage and the measured energy usage at one or more temperatures based on the number of days the one or more temperatures occurred during the period of time; and
adjust the baseline using the weighting for operating subsystems of the building to reduce an amount of energy consumption.

9. The data processing system of claim 8, wherein the processor is further configured to execute the instructions of the weighting application to generate an estimate of energy usage at the building for the period of time based on the weighted difference.

10. The data processing system of claim 9, wherein the period of time is a year and wherein the number of days is an average number of days in a year that that a daily temperature for the location is at a certain temperature degree.

11. The data processing system of claim 8, wherein the processor is further configured to execute the instructions of the weighting application to generate, using the weighted difference, an estimate of a reduction in energy usage at the building as a result of energy-saving measures enacted at the building between a time when the baseline for initial energy usage was calculated and a time when the measurements for energy usage at the building were measured.

12. The data processing system of claim 8, wherein to identify the baseline for initial energy usage at the building, the processor is further configured to execute the instructions of the weighting application to:
receive an initial set of measurements for energy usage at the building and corresponding temperature values;
generate a weighting for each measurement in the initial set based on the number of days that a temperature associated with the each measurement occurred during the period of time;
generate a plurality of pairs of weighted energy usage and temperature data points by applying the weighting to the each measurement; and
generate the baseline for initial energy usage at the building by performing a regression analysis on the plurality of pairs of data points.

13. The data processing system of claim 8, wherein to generate the weighting for the difference, the processor is further configured to execute the instructions of the weighting application to set a weighting for a difference in energy usage at a temperature occurring more frequently during the period of time higher than a weighting for a difference in energy usage at a temperature occurring less frequently during the period of time.

14. The data processing system of claim 8, wherein to identify the number of days that each of the plurality of different temperatures occurred at the location during the period of time, the processor is further configured to execute the instructions of the weighting application to:
receive historical temperature data comprising temperature values for a previous period of time at the location where the building is located; and
generate a historical temperature distribution for the number of days in a year that the different temperatures occur.

15. A non-transitory computer-readable medium encoded with executable instructions that, when executed, cause one or more data processing systems to:
identify a number of days that each of a plurality of different temperatures occurred at a location during a period of time;
identify a baseline for initial energy usage at a building located in the location;
receive measurements for energy usage at the building;
generate an expression for measured energy usage as a function of temperature by performing a regression analysis on the measurements for energy usage;
identify a difference between the baseline for initial energy usage and the expression for measured energy usage;
generate a weighting for the difference between baseline energy usage and the measured energy usage at one or more temperatures based on the number of days the one or more temperatures occurred during the period of time; and
adjust the baseline using the weighting for operating subsystems of the building to reduce an amount of energy consumption.

16. The computer-readable medium of claim 15, wherein the computer-readable medium is further encoded with executable instructions that, when executed, cause one or more data processing systems to generate an estimate of energy usage at the building for the period of time based on the weighted difference.

17. The computer-readable medium of claim 16, wherein the period of time is a year and wherein the number of days is an average number of days in a year that that a daily temperature for the location is at a certain temperature degree.

18. The computer-readable medium of claim 15, wherein the computer-readable medium is further encoded with executable instructions that, when executed, cause one or more data processing systems to generate, using the weighted difference, an estimate of a reduction in energy usage at the building as a result of energy-saving measures enacted at the building between a time when the baseline for initial energy usage was calculated and a time when the measurements for energy usage at the building were measured.

19. The computer-readable medium of claim 15, wherein the instructions that cause the one or more data processing systems to identify the baseline for initial energy usage at the building comprise instructions that cause the one or more data processing systems to:

receive an initial set of measurements for energy usage at the building and corresponding temperature values;

generate a weighting for each measurement in the initial set based on the number of days that a temperature associated with the each measurement occurred during the period of time;

generate a plurality of pairs of weighted energy usage and temperature data points by applying the weighting to the each measurement; and generate the baseline for initial energy usage at the building by performing a regression analysis on the plurality of pairs of data points.

20. The computer-readable medium of claim 15, wherein the instructions that cause the one or more data processing systems to generate the weighting for the difference comprise instructions that cause the one or more data processing systems to set a weighting for a difference in energy usage at a temperature occurring more frequently during the period of time higher than a weighting for a difference in energy usage at a temperature occurring less frequently during the period of time.

* * * * *